(12) United States Patent
Uzoh et al.

(10) Patent No.: US 12,051,621 B2
(45) Date of Patent: Jul. 30, 2024

(54) MICROELECTRONIC ASSEMBLY FROM PROCESSED SUBSTRATE

(71) Applicant: ADEIA SEMICONDUCTOR BONDING TECHNOLOGIES INC., San Jose, CA (US)

(72) Inventors: Cyprian Emeka Uzoh, San Jose, CA (US); Laura Wills Mirkarimi, Sunol, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/825,405

(22) Filed: May 26, 2022

(65) Prior Publication Data

US 2022/0285213 A1 Sep. 8, 2022

Related U.S. Application Data

(60) Continuation of application No. 16/842,233, filed on Apr. 7, 2020, now Pat. No. 11,367,652, which is a
(Continued)

(51) Int. Cl.
*H01L 21/768* (2006.01)
*B24B 37/04* (2012.01)
(Continued)

(52) U.S. Cl.
CPC ...... *H01L 21/76868* (2013.01); *B24B 37/042* (2013.01); *B81B 7/0006* (2013.01);
(Continued)

(58) Field of Classification Search
None
See application file for complete search history.

(56) References Cited

U.S. PATENT DOCUMENTS 5,341,979 A 8/1994 Gupta
5,753,536 A 5/1998 Sugiyama et al.
(Continued)

FOREIGN PATENT DOCUMENTS

CN 103681646 3/2014
EP 2 339 614 A1 6/2011
(Continued)

OTHER PUBLICATIONS

Fukushima, Takafumi et al., "Oxide-oxide thermocompression direct bonding technologies with capillary self-assembly for multichip-to-wafer heterogeneous 3D system integration," Micromachines, Oct. 2016, vol. 7, No. 184, pp. 18 pages.
(Continued)

*Primary Examiner* — Long Pham
(74) *Attorney, Agent, or Firm* — Knobbe, Martens, Olson & Bear, LLP

(57) ABSTRACT

Representative implementations of techniques, methods, and formulary provide repairs to processed semiconductor substrates, and associated devices, due to erosion or "dishing" of a surface of the substrates. The substrate surface is etched until a preselected portion of one or more embedded interconnect devices protrudes above the surface of the substrate. The interconnect devices are wet etched with a selective etchant, according to a formulary, for a preselected period of time or until the interconnect devices have a preselected height relative to the surface of the substrate. The formulary includes one or more oxidizing agents, one or more organic acids, and glycerol, where the one or more oxidizing agents and the one or more organic acids are each less than 2% of formulary and the glycerol is less than 10% of the formulary.

28 Claims, 4 Drawing Sheets

200 —

(A)

(B)

Related U.S. Application Data division of application No. 15/849,325, filed on Dec. 20, 2017, now Pat. No. 10,672,654.

(60) Provisional application No. 62/439,762, filed on Dec. 28, 2016, provisional application No. 62/439,746, filed on Dec. 28, 2016.

(51) Int. Cl.

| | | |
|---|---|---|
| *B81B 7/00* | (2006.01) | |
| *B81C 1/00* | (2006.01) | |
| *C23F 3/00* | (2006.01) | |
| *H01L 21/306* | (2006.01) | |
| *H01L 21/311* | (2006.01) | |
| *H01L 21/321* | (2006.01) | |
| *H01L 21/3213* | (2006.01) | |
| *H01L 23/00* | (2006.01) | |
| *C23F 1/18* | (2006.01) | |
| *H01L 23/522* | (2006.01) | |
| *H01L 25/065* | (2023.01) | |

(52) U.S. Cl.
CPC ............ *B81C 1/00095* (2013.01); *C23F 3/00* (2013.01); *H01L 21/30625* (2013.01); *H01L 21/31111* (2013.01); *H01L 21/3212* (2013.01); *H01L 21/32134* (2013.01); *H01L 21/32135* (2013.01); *H01L 21/7684* (2013.01); *H01L 21/76883* (2013.01); *H01L 24/80* (2013.01); *H01L 24/81* (2013.01); *C23F 1/18* (2013.01); *H01L 21/76898* (2013.01); *H01L 23/5226* (2013.01); *H01L 24/05* (2013.01); *H01L 24/08* (2013.01); *H01L 24/13* (2013.01); *H01L 24/16* (2013.01); *H01L 25/0657* (2013.01); *H01L 2224/05647* (2013.01); *H01L 2224/08145* (2013.01); *H01L 2224/08225* (2013.01); *H01L 2224/16145* (2013.01); *H01L 2224/16225* (2013.01); *H01L 2224/80031* (2013.01); *H01L 2224/80895* (2013.01); *H01L 2225/06506* (2013.01); *H01L 2225/06524* (2013.01); *H01L 2924/14* (2013.01); *H01L 2924/1433* (2013.01)

(56) References Cited

U.S. PATENT DOCUMENTS

| | | |
|---|---|---|
| 5,771,555 A | 6/1998 | Eda et al. |
| 6,080,640 A | 6/2000 | Gardner et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,385,283 B2 | 6/2008 | Wu et al. |
| 7,566,634 B2 | 7/2009 | Beyne et al. |
| 7,750,488 B2 | 7/2010 | Patti et al. |
| 7,790,578 B2 | 9/2010 | Furui |
| 7,803,693 B2 | 9/2010 | Trezza |
| 8,026,181 B2 | 9/2011 | Arita et al. |
| 8,147,630 B2 | 4/2012 | George |
| 8,183,127 B2 * | 5/2012 | Patti ................. H01L 23/585 |
| | | 438/455 |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,513,810 B2 | 8/2013 | Tago |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,901,736 B2 | 12/2014 | Shen et al. |
| 8,975,163 B1 | 3/2015 | Lei et al. |
| 9,029,242 B2 | 5/2015 | Holden et al. |
| 9,076,860 B1 | 7/2015 | Lei et al. |
| 9,076,929 B2 | 7/2015 | Katsuno et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 * | 4/2016 | Chen .................. H01L 23/5226 |
| 9,331,149 B2 | 5/2016 | Tong et al. |
| 9,337,235 B2 | 5/2016 | Chen et al. |
| 9,373,527 B2 | 6/2016 | Yu et al. |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,564,414 B2 | 2/2017 | Enquist et al. |
| 9,620,481 B2 | 4/2017 | Edelstein et al. |
| 9,656,852 B2 | 5/2017 | Cheng et al. |
| 9,673,096 B2 | 6/2017 | Hirschler et al. |
| 9,674,939 B2 | 6/2017 | Scannell |
| 9,704,827 B2 | 7/2017 | Huang et al. |
| 9,716,033 B2 | 7/2017 | Enquist et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,852,988 B2 | 12/2017 | Enquist et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,410,976 B2 | 9/2019 | Asano et al. |
| 10,418,277 B2 | 9/2019 | Cheng et al. |
| 10,434,749 B2 | 10/2019 | Tong |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |

(56) References Cited

U.S. PATENT DOCUMENTS

| | | |
|---|---|---|
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,985,204 B2 | 4/2021 | Von Kanel |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,515,291 B2 | 11/2022 | DeLaCruz et al. |
| 11,626,363 B2 | 4/2023 | Haba et al. |
| 11,631,647 B2 | 4/2023 | Haba |
| 11,652,083 B2 | 5/2023 | Uzoh et al. |
| 11,664,357 B2 | 5/2023 | Fountain, Jr. et al. |
| 11,721,653 B2 | 8/2023 | DeLaCruz et al. |
| 11,728,273 B2 | 8/2023 | Haba |
| 11,735,523 B2 | 8/2023 | Uzoh |
| 11,742,314 B2 | 8/2023 | Uzoh et al. |
| 11,749,645 B2 | 9/2023 | Gao et al. |
| 11,762,200 B2 | 9/2023 | Katkar et al. |
| 11,764,177 B2 | 9/2023 | Haba |
| 11,842,894 B2 | 12/2023 | Katkar et al. |
| 11,876,076 B2 | 1/2024 | DeLaCruz et al. |
| 2002/0003307 A1 | 1/2002 | Suga |
| 2003/0071106 A1 | 4/2003 | Bendat et al. |
| 2003/0148591 A1 | 8/2003 | Guo et al. |
| 2004/0084414 A1 | 5/2004 | Sakai et al. |
| 2005/0101130 A1 | 5/2005 | Lopatin et al. |
| 2005/0161795 A1 | 7/2005 | Tong et al. |
| 2005/0161808 A1 | 7/2005 | Anderson |
| 2006/0057945 A1 | 3/2006 | Hsu et al. |
| 2007/0111386 A1 | 5/2007 | Kim et al. |
| 2007/0123061 A1 | 5/2007 | Evertsen et al. |
| 2007/0148912 A1 | 6/2007 | Morita et al. |
| 2007/0262468 A1 | 11/2007 | Nasu et al. |
| 2008/0006938 A1 | 1/2008 | Patti et al. |
| 2008/0064189 A1 | 3/2008 | Daubenspeck et al. |
| 2008/0268614 A1 | 10/2008 | Yang et al. |
| 2009/0029274 A1 | 1/2009 | Olson et al. |
| 2009/0095399 A1 | 4/2009 | Zussy et al. |
| 2010/0096699 A1 | 4/2010 | Miyata |
| 2011/0084403 A1 | 4/2011 | Yang et al. |
| 2011/0308738 A1 | 12/2011 | Maki et al. |
| 2012/0068355 A1 | 3/2012 | Aoki et al. |
| 2012/0119258 A1 | 5/2012 | Liang |
| 2012/0238070 A1 | 9/2012 | Libbert et al. |
| 2013/0009321 A1 | 1/2013 | Kagawa et al. |
| 2014/0015088 A1 | 1/2014 | Chapelon |
| 2014/0145338 A1 | 5/2014 | Fujii et al. |
| 2014/0175655 A1 | 6/2014 | Chen et al. |
| 2014/0187040 A1 | 7/2014 | Enquist et al. |
| 2014/0264948 A1 | 9/2014 | Chou et al. |
| 2014/0319656 A1 | 10/2014 | Marchena et al. |
| 2015/0064498 A1 | 3/2015 | Tong |
| 2015/0145140 A1 | 5/2015 | Haba et al. |
| 2015/0364434 A1 | 12/2015 | Chen et al. |
| 2016/0013099 A1* | 1/2016 | Tanida ............... H01L 24/08 438/107 |
| 2016/0071770 A1 | 3/2016 | Albermann et al. |
| 2016/0181228 A1 | 6/2016 | Higuchi et al. |
| 2016/0197055 A1* | 7/2016 | Yu .................. H01L 24/05 257/737 |
| 2016/0233175 A1 | 8/2016 | Dubey et al. |
| 2016/0343682 A1 | 11/2016 | Kawasaki |
| 2017/0154768 A1 | 6/2017 | Zhao |
| 2017/0200756 A1 | 7/2017 | Kao et al. |
| 2017/0250172 A1 | 8/2017 | Huang et al. |
| 2018/0102286 A1* | 4/2018 | Uzoh ............ H01L 23/53238 |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226371 A1 | 8/2018 | Enquist |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0088527 A1 | 3/2019 | Uzoh |
| 2019/0115277 A1 | 4/2019 | Yu et al. |
| 2019/0131277 A1 | 5/2019 | Yang et al. |
| 2019/0148336 A1 | 5/2019 | Chen et al. |
| 2019/0152773 A1 | 5/2019 | Herbsommer et al. |
| 2019/0198409 A1 | 6/2019 | Katkar et al. |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043910 A1 | 2/2020 | Uzoh et al. |
| 2020/0058617 A1 | 2/2020 | Wu et al. |
| 2020/0075520 A1 | 3/2020 | Gao et al. |
| 2020/0075533 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0227367 A1 | 7/2020 | Haba et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |

(56) References Cited

U.S. PATENT DOCUMENTS

| | | |
|---|---|---|
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0246564 A1 | 8/2022 | Gao et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187398 A1 | 6/2023 | Gao et al. |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0282610 A1 | 9/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |

FOREIGN PATENT DOCUMENTS

| | | |
|---|---|---|
| EP | 2 685 491 A2 | 1/2014 |
| JP | 04-337694 | 11/1992 |
| JP | 2000-100679 | 4/2000 |
| JP | 2001-102479 | 4/2001 |
| JP | 2002-353416 A | 12/2002 |
| JP | 2004-193493 | 7/2004 |
| JP | 2009-135348 | 6/2009 |
| JP | 2010-073964 | 4/2010 |
| JP | 2013-033786 A | 2/2013 |
| JP | 2017-130610 | 7/2017 |
| JP | 2018-160519 | 10/2018 |
| KR | 10-0386954 B1 | 6/2003 |
| KR | 10-2004-0020827 | 3/2004 |
| KR | 10-2015-0097798 | 8/2015 |
| WO | WO 2005/043584 A2 | 5/2005 |
| WO | WO 2009/005898 A1 | 1/2009 |
| WO | WO 2010/024678 A1 | 3/2010 |
| WO | WO 2014/052445 A1 | 4/2014 |
| WO | WO 2015/134227 A1 | 9/2015 |
| WO | WO 2017/151442 A1 | 9/2017 |

OTHER PUBLICATIONS

Ker, Ming-Dou et al., "Fully process-compatible layout design on bond pad to improve wire bond reliability in CMOS ICS," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 p.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Leissa, A.W., "Vibration of Plates," NASA SP-160, 1969, 362 pages.

Lim, K. et al., "Design and simulation of symmetric wafer-to-wafer bonding compensating a gravity effect," 2020 IEEE 70th Electronic Components and Technology Conference (ECTC), doi: 10.1109/ECTC32862.2020.00234 (2020), 6 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

Zgheib, Elia. et al., "Multilayered models for determining the Young's modulus of thin films by means of Impulse Excitation Technique," https://www.sciencedirect.com/science/article/pii/S0167663619304752, Manuscript_68d36734cad5d1ad97e7-c65bfb45f5d1, 2019, 39 pages.

"Die-to-Wafer Fusion and Hybrid Bonding," EV Group, https://www.evgroup.com/technologies/die-to-wafer-fusion-and-hybrid-bonding/, printed Sep. 21, 2022, 8 pages.

(56) References Cited

OTHER PUBLICATIONS

"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
"The effects of edge trimming—Engineering R&D Division, Operation V," Disco Technical Review Mar. 2016, 3 pages.
"Lecture 29: Productivity and process yield," National Programme on Technology Enhanced Learning (NPTEL), MM5017: Electronic materials, devices, and fabrication, 16 pages.
Amirfeiz et al., "Formation of silicon structures by plasma-activated wafer bonding," Journal of The Electrochemical Society, 2000, vol. 147, No. 7, pp. 2693-2698.
Ceramic Microstructures: Control at the Atomic Level, Recent Progress in Surface Activated Bonding, Abstract, 1998, pp. 385-389.
Chang, T.C. et al., "A method for fabricating a superior oxide/ nitride/oxide gate stack," Electrochemical and Solid-State Letters, 2004, vol. 7, No. 7, pp. G138-G140.
Chung et al., "Room temperature GaAs—Si and InP—Si wafer direct bonding by the surface activate bonding method," Abstract, Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Abstract, Applied Surface Science, Jun. 2, 1997, vol. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnandTech, https://www.anandtech.com/show/16031/tsmcs-version-of-emib-Isi-3dfabric, Aug. 25, 2020, 6 pages.
Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.
Gösele et al., "Semiconductor Wafer Bonding: A flexible approach to materials combinations in microelectronics; micromechanics and optoelectronics," IEEE, 1997, pp. 23-32.
Hooper, A. et al. "Review of wafer dicing techniques for via-middle process 3DI/TSV ultrathin silicon device wafers," 2015 IEEE 65th Electronic Components and Technology Conference (ECTC).
Hosoda et al., "Effect of the surface treatment on the room-temperature bonding of AI to Si and SiO2," Abstract, Journal of Materials Science, Jan. 1, 1998, vol. 33, Issue 1, pp. 253-258.
Hosoda et al., "Room temperature GaAs—Si and InP—Si wafer direct bonding by the surface activated bonding method," Abstract, Nuclear Inst. And Methods in Physics Research B, 1997, vol. 121, Nos. 1-4, pp. 203-206.
Howlader et al., "A novel method for bonding of ionic wafers," Abstract, Electronics Components and Technology Conference, 2006, IEEE, pp. 7-pp.
Howlader et al., "Bonding of p-Si/n-InP wafers through surface activated bonding method at room temperature," Abstract, Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

Itoh et al., "Characteristics of fritting contacts utilized for micromachined wafer probe cards," Abstract, 2000 American Institute of Physics, AIP Review of Scientific Instruments, vol. 71, 2000, pp. 2224.
Itoh et al., "Characteristics of low force contact process for MEMS probe cards," Abstract, Sensors and Actuators A: Physical, Apr. 1, 2002, vols. 97-98, pp. 462-467.
Itoh et al., "Development of MEMS IC probe card utilizing fritting contact," Abstract, Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.
Kim et al., "Low temperature direct Cu—Cu bonding with low energy ion activation method," Abstract, Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Abstract, Proceedings—Electrochemical Society, 2003, vol. 19, pp. 239-247.
Lei, W.S. et al., "Die singulation technologies for advanced packaging: A critical review," J. Vac. Sci. Technol. B 30(4), Apr. 6, 2012, Jul./Aug. 1012, pp. 040801-1-040801-27.
Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Abstract, Electronic Components and Technology Conference, 2001, 51st Proceedings, IEEE, pp. 384-387.
NASA SBIR/STTR Technologies, Proposal No. 09-1 S5.05-9060— Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Onodera et al., "The effect of prebonding heat treatment on the separability of Au wire from Ag-plated Cu alloy substrate," Abstract, Electronics Packaging Manufacturing, IEEE Transactions, Jan. 2002, vol. 25, Issue 1, pp. 5-12.
Reiche et al., "The effect of a plasma pretreatment on the Si/Si bonding behaviour," Electrochemical Society Proceedings, 1998, vol. 97-36, pp. 437-444.
Roberds et al., "Low temperature, in situ, plasma activated wafer bonding," Electrochemical Society Proceedings, 1997, vol. 97-36, pp. 598-606.
Shigetou et al., "Room temperature bonding of ultra-fine pitch and low-profiled Cu electrodes for bump-less interconnect," Abstract, 2003 Electronic Components and Technology Conference, pp. 848-852.
Shigetou et al., "Room-temperature direct bonding of CMP-Cu film for bumpless interconnection," Abstract, Electronic Components and Technology Conference, 51st Proceedings, 2001, IEEE, pp. 755-760.
Shingo et al., "Design and fabrication of an electrostatically actuated MEMS probe card," Abstract, Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," Abstract, IEMT/IMC Symposium, 1997, Joint International Electronic Manufacturing Symposium and the International Microelectronics Conference, Apr. 16-18, 1997, IEEE, pp. 146-151.

(56) References Cited

OTHER PUBLICATIONS

Suga et al., "A new bumping process using lead-free solder paste," Abstract, Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Abstract, Electronic Components and Technology Conference, 2001, IEEE, pp. 1013-1018.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Abstract, Electronic Components and Technology Conference, 2002, IEEE, pp. 105-111.

Suga, "UHV room temperature joining by the surface activated bonding method," Abstract, Advances in science and technology, Techna, Faenza, Italie, 1999, pp. C1079-C1089.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Takagi et al., "Wafer-scale room-temperature bonding between silicon and ceramic wafers by means of argon-beam surface activation," Abstract, Micro Electro Mechanical Systems, 2001, MEMS 2001, The 14th IEEE International Conference, Jan. 25, 2001, IEEE, pp. 60-63.

Takagi et al., "Effect of surface roughness on room-temperature wafer bonding by Ar beam surface activation," Japanese Journal of Applied Physics, 1998, vol. 37, Part 1, No. 1, pp. 4197-4203.

Takagi et al., "Low temperature direct bonding of silicon and silicon dioxide by the surface activation method," Abstract, Solid State Sensors and Actuators, 1997, Transducers '97 Chicago, 1997 International Conference, vol. 1, pp. 657-660.

Takagi et al., "Room temperature silicon wafer direct bonding in vacuum by Ar beam irradiation," Abstract, Micro Electro Mechanical Systems, MEMS '97 Proceedings, 1997, IEEE, pp. 191-196.

Takagi et al., "Room-temperature bonding of lithium niobate and silicon wafers by argon-beam surface activation," Abstract, Appl. Phys. Lett., 1999. vol. 74, p. 2387.

Takagi et al., "Room-temperature wafer bonding of Si to LiNbO3, LiTaO3 and Gd3Ga5O12 by Ar-beam surface activation," Abstract, Journal of Micromechanics and Microengineering, 2001, vol. 11, No. 4, p. 348.

Takagi et al., "Room-temperature wafer bonding of silicon and lithium niobate by means of arbon-beam surface activation," Abstract, Integrated Ferroelectrics: An International Journal, 2002, vol. 50, Issue 1, pp. 53-59.

Takagi et al., "Surface activated bonding silicon wafers at room temperature," Abstract, Appl. Phys. Lett. 68, 2222 (1996).

Takagi et al., "Wafer-scale spontaneous bonding of silicon wafers by argon-beam surface activation at room temperature," Abstract, Sensors and Actuators A: Physical, Jun. 15, 2003, vol. 105, Issue 1, pp. 98-102.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Urteaga, M. et al., "THz bandwidth InP HBT technologies and heterogeneous integration with Si ICMOS," 2016 IEEE Bipolar/BiCMOS Circuits and Technology Meeting (BCTM), 2016, pp. 35-41, doi:10.1109/BCTM.2016.7738973.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Abstract, Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Abstract, Electronic Packaging Technology Proceedings, Oct. 28-30, 2003, Shanghai, China, pp. 479-483.

* cited by examiner

MICROELECTRONIC ASSEMBLY FROM PROCESSED SUBSTRATE

PRIORITY CLAIM AND CROSS-REFERENCE TO RELATED APPLICATION

This application is a Continuation of U.S. patent application Ser. No. 16/842,233 filed Apr. 7, 2020, which is a Divisional of U.S. patent application Ser. No. 15/849,325 filed Dec. 20, 2017 and issued as U.S. Pat. No. 10,672,654, and also claims the benefit under 35 U.S.C. § 119(e)(1) of U.S. Provisional Application No. 62/439,762, filed Dec. 28, 2016, and U.S. Provisional Application No. 62/439,746, filed Dec. 28, 2016, the disclosures of each of which are hereby incorporated herein by reference in their entirety.

FIELD

The following description relates to processing of integrated circuits ("ICs"). More particularly, the following description relates to techniques for repairing processed substrates.

BACKGROUND

Semiconductor chips are fabricated on suitable flat substrate wafers, such as GaAs, diamond coated substrates, silicon carbide, silicon wafers, etc. After making the active devices, a series of steps are performed to connect the various devices with highly conducting wiring structures, so they can have communication with each other to perform logic or memory storage operations. These wiring structures or interconnect structures are essentially a skeletal network of conducting materials, typically metals, in a matrix of dielectric materials. In high performance devices and to improve device density and yield, it is desirable to minimize topographic features within the interconnect layers for any given device and across the entire substrate. One common method of forming these high-performance interconnect layers is the damascene process.

Multiple types of damascene structures are known, however single and dual damascene processes are the most common. In single damascene, each metal or via layer is fabricated in a series of operations, while in dual damascene, a metal level and a via level are fabricated in a similar operation. Of these two, the dual damascene technique is often preferred because of lower cost and higher device performance.

In the dual damascene process, a suitable substrate with or without devices is coated with a suitable resist layer. The resist layer is imaged to define desirable patterns by lithographic methods on the substrate. Cavities are etched on the patterned substrates typically by reactive ion etching (RIE) methods. The patterned substrate is then coated with a suitable barrier/seed layer prior to overfilling the cavities with a suitable metal, typically copper, by electro-deposition from super-filling plating bath chemistry. After subjecting the coated substrate to a thermal treatment process, the coated conductive layer on the substrate is planarized to remove any unwanted conductive layers. During the planarization step, portions of the underlying dielectric layer may also be removed.

The damascene process is repeated to form the many layers of interconnects. As a result of the discontinuity in the properties (difference in mechanical properties, polishing rates, etc.) of the interconnect metal and the surrounding insulator material, and their respective interactions with the polishing pad, polishing slurry, and other process parameters, erosion forms in areas of high metal pattern density features and dishing forms in large metal structures. The higher the metal pattern density, the greater the erosion, and similarly, the larger the size (e.g., area) of the metal structure, the greater the dishing defect. These deleterious defects can be problematic for manufacturing complex structures, causing shorting defects in subsequent levels, and reducing device yield.

Similar results are observed in cross section topographic profiles of polished through silicon via (TSV) structures. The centers of the vias are often typically lower than the surface of the insulators, due to the dishing effects described.

One of the consequences of substrate surface dishing is poor flatness of the surface of the substrate and its interconnects. This can cause much higher pressures to be needed for bonding devices, dies, wafers, substrates, or the like, using so called hybrid bonding techniques. For example, dies and/or wafers may be bonded in a stacked arrangement using various bonding techniques, including direct bonding, non-adhesive techniques known as ZiBond® or a hybrid bonding technique, also known as DBI®, both available from Invensas Bonding Technologies, Inc., a Xperi company (see for example, U.S. Pat. Nos. 6,864,585 and 7,485,968, which are incorporated herein in their entirety). These bonding techniques, and other similar techniques, require extremely flat bonding surfaces for the most reliable and the best performing bonds.

Attempts to reduce the impact of these defects have included the incorporation of dummy dielectric or metal features in the layout of the design of device interconnects. This approach has been helpful, but it has also increased mask design complexity and the associated loss of freedom of structure placement on the modified pads.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

SUMMARY

Figure 1:
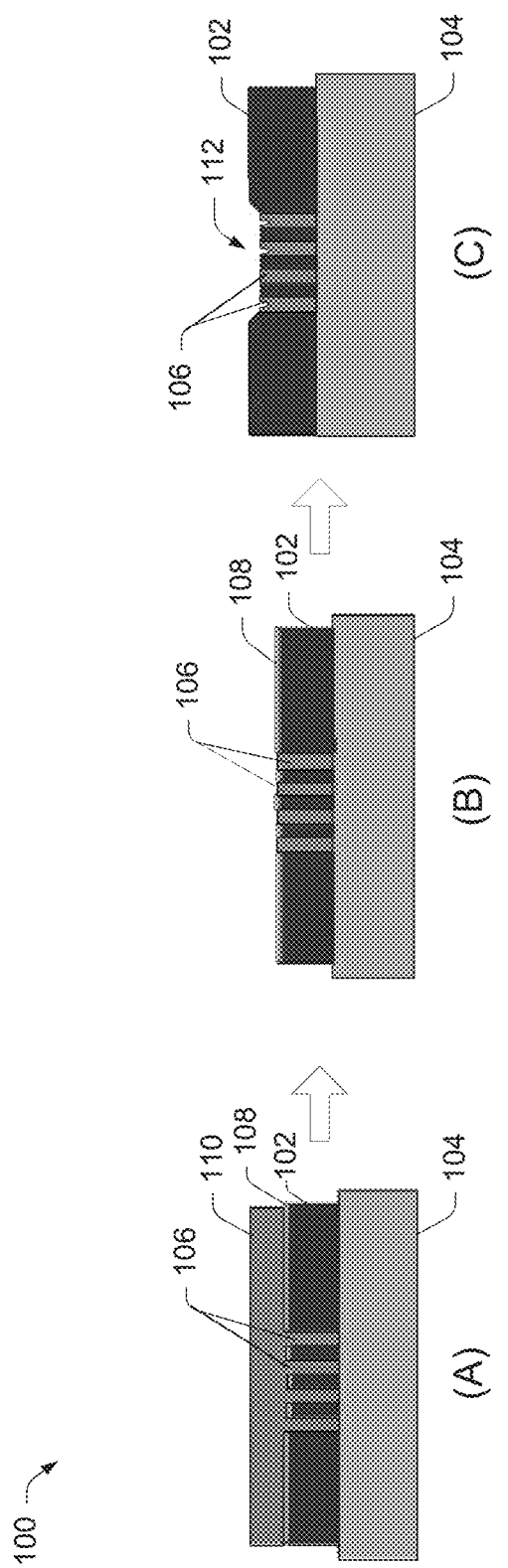
FIG. 1 is a schematically illustrated block flow diagram illustrating an example substrate processing sequence and the resulting dishing of the substrate.

Various embodiments of methods and techniques for repairing processed semiconductor substrates, and forming associated devices and assemblies, are disclosed. The embodiments comprise methods to remedy and/or to take advantage of the erosion or "dishing" resulting from chemical mechanical polishing/planarizing (CMP) of the substrates, and particularly at locations where there is a higher density of metallic structures embedded within the substrates. In some embodiments, unique formularies are used to carry out the described methods and techniques.

In various implementations, example processes include dry etching the surface of the substrate, until a preselected portion of the conductive material protrudes from the cavities above the surface of a recessed region in the surface of the substrate. In some embodiments, a first selective etchant (a wet etchant) may also be applied to etch the surface of the substrate, forming a smooth flat surface, without damaging the metallic interconnect structures.

In some implementations, the example processes include selectively wet etching the conductive material protruding from the cavities, including applying a second selective etchant to the conductive material for a preselected period of time or until an end point of the conductive material has a preselected height relative to the surface of the substrate. In various embodiments, the second selective etchant is formulated to remove the conductive material, without roughening the smooth surface of the substrate.

A second substrate with similar interconnect structures may be bonded to the substrate, with the interconnects of each of the substrates making contact and electrically coupling. The coupled interconnects form pass-through conductive interconnections through both substrates.

In an example implementation, the first selective etchant comprises a source of fluoride ions, one or more organic acids, and glycerol, with or without a complexing agent, where a content of the source of fluoride ions is less than 2% of the formulary, a content of the one or more organic acids is less than 2% of the formulary, and a content of the glycerol is less than 10% of the formulary. In another example implementation, the second selective etchant comprises one or more oxidizing agents, one or more organic acids, and glycerol, where the one or more oxidizing agents and the one or more organic acids are each less than 2% of formulary. The oxidizing agent may be organic or inorganic material or both, and in some embodiments, the acidic chemicals may comprise an organic or an inorganic acid or a combination of both. The glycerol or other suitable agent may slow the etch rate of the substrate, interconnect or other layer without roughening some or all of the surfaces. Thus, by controlling the chemistry, different features and surfaces may be selectively etched, e.g. a dielectric may be selectively etched using one chemistry that does not affect a conductive layer, followed by a conductive material being selectively etched using a slightly different chemistry or process condition so as not to materially affect the dielectric layer.

In an alternate implementation, the first selective etchant and the second selective etchant include a common formulary. In the implementation, combining the common formulary with one or more additives at preselected process stages allows for the etching of dielectric (e.g., the first selective etchant) or the etching of metals (e.g., the second selective etchant) as appropriate for the process stage.

Various implementations and arrangements are discussed with reference to electrical and electronics components and varied carriers. While specific components (i.e., wafers, integrated circuit (IC) chip dies, etc.) are mentioned, this is not intended to be limiting, and is for ease of discussion and illustrative convenience. The techniques and devices discussed with reference to a wafer, die, or any substrate or surface of interest, and the like, are applicable to any type or number of electrical components, circuits (e.g., integrated circuits (IC), mixed circuits, ASICS, memory devices, processors, etc.), groups of components, packaged components, structures (e.g., wafers, panels, glasses, glass-ceramics, boards, PCBs, etc.), and the like, that may be coupled to interface with each other, with external circuits, systems, carriers, and the like. Each of these different components, circuits, groups, packages, structures, and the like, can be generically referred to as a "microelectronic element." For simplicity, such components will also be referred to herein as a "die" or a "substrate."

The disclosed processes are illustrated using block flow diagrams. The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Implementations are explained in more detail below using a plurality of examples. Although various implementations and examples are discussed here and below, further implementations and examples may be possible by combining the features and elements of individual implementations and examples.

DETAILED DESCRIPTION

Overview

Various embodiments of substrate structure and assembly process techniques and related devices are disclosed. The embodiments comprise process techniques to remedy or to utilize the erosion or "dishing" that can result from chemical mechanical polishing/planarizing (CMP) of substrates, and particularly at locations where there is a higher density of metallic structures within the substrates.

A schematically illustrated flow diagram 100 is shown at FIG. 1, illustrating an example substrate processing sequence and the resulting dishing and erosion 112 of the substrate 102. Substrates 102 may include wafers, comprising GaAs or other semiconductors, diamond coated substrates, silicon carbide, silicon wafers, dielectrics, flat panels, glasses, ceramics, circuit boards, packages, interposers, structures with or without an embedded device or devices, and so forth. For clarity, the substrate 102 comprises a surface of interest processed for intimate contact with another surface.

As shown in FIG. 1 at block (A), a substrate 102 is coupled to a carrier 104. The carrier 104 may comprise a semiconductor device, a handle wafer, a glass panel, a backend of the line routing layer, an RDL layer, a wiring structure, etc. Cavities or trenches are formed in the substrate 102 for forming conductive interconnect structures 106, or the like. Some cavities may be blind cavities, where the bottom surface of the cavities contacts the wiring features beneath. In some applications, the cavities may be through-hole cavities. Other cavities are etched in a dielectric material with or without wiring features beneath the cavity.

A barrier metal layer 108 is applied to the surface of the substrate 102, to serve as an adhesive layer and also to prevent diffusion of conductive material into the substrate 102. An electroplating or electroless process (or a combination of both) may be used to fill the cavities in the substrate 102 with a conductive material (such as copper, for example), to form the interconnect structures 106, vias, trenches, combinations of vias and trenches, or the like. The metal filling step commonly leaves an overfill 110 of the conductive material on the surface of the substrate 102 and barrier layer 108.

As shown at block (B), the conductive overfill 110 can be removed (here, to the barrier layer 108), by chemical mechanical polishing (CMP), for example. At block (C), a CMP process is further used to remove the metallic barrier layer 108. As shown at (C), CMP polishing the substrate 102 can result in dielectric erosion and dishing 112 at the location of the interconnect structures 106. For example, depending on the polishing variables, the erosion 112 may be greater than 20 nm in depth for damascene cavities less than 1 micron in depth. Erosion may further be affected by the proximity of adjacent conductive features and interconnect structures 106.

Bonding techniques, such as a direct bond interconnect (DBI) technique, for example, may use pressure and/or heat to bond a substrate 102 to another similar or dissimilar substrate, including bonding the respective interconnects of the substrates. Bonding a substrate 102 with large erosion 112 to another substrate can result in a gap at the location of the erosion 112. In some cases, the gap can be a source of poor bonding between the substrates, and can also cause discontinuity between bonded interconnect structures 106 (the interconnects 106 may be electrically open after bonding). Additionally, bonded substrates 102 with larger erosion 112 and comparatively high dishing typically exhibit poor interfacial bond strength and interconnect 106 reliability.

Example Embodiments

Figure 2:
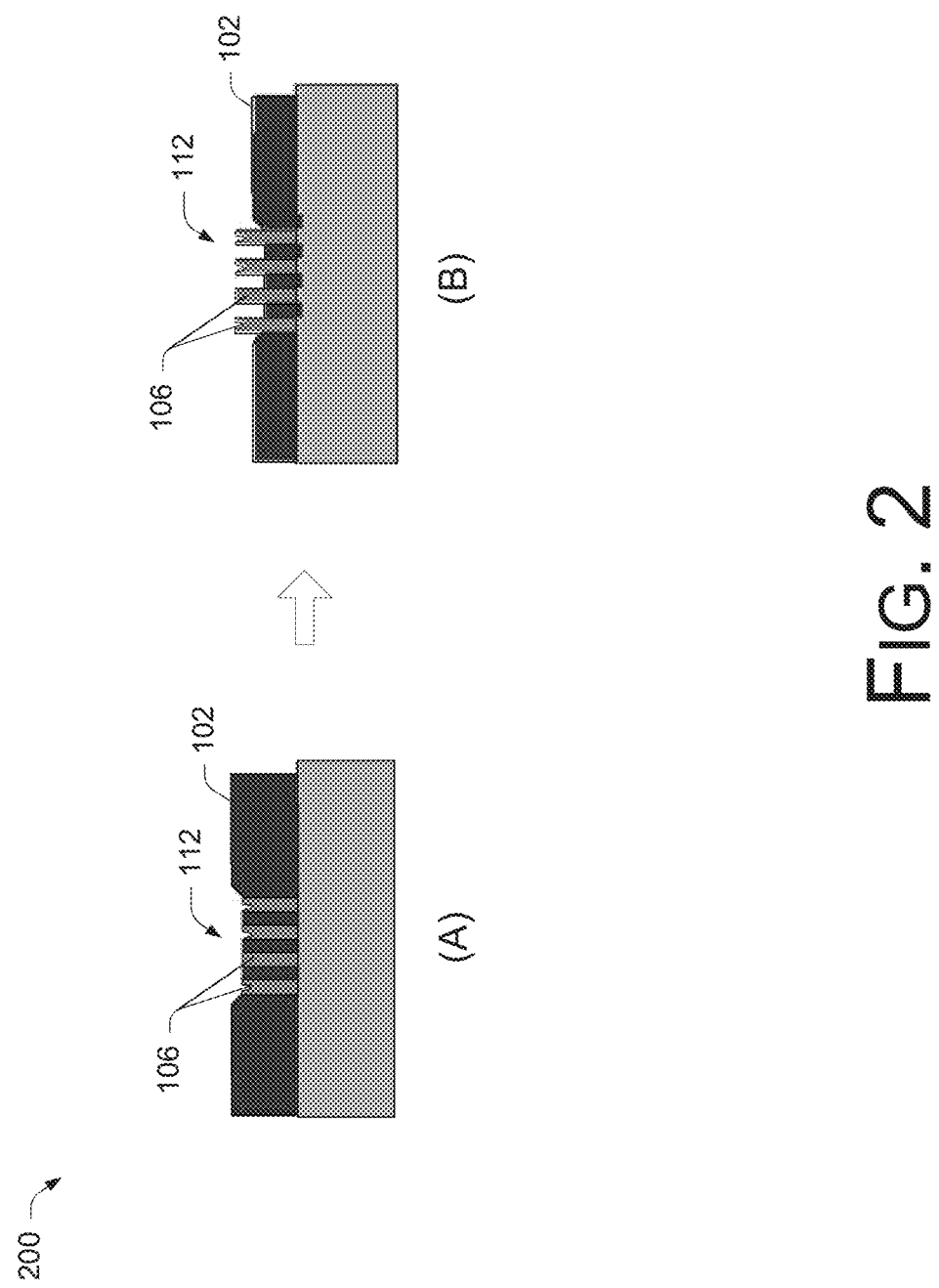
FIG. 2 is a schematically illustrated block flow diagram illustrating an example substrate processing and repair sequence, according to an embodiment.

FIG. 2 is a schematically illustrated flow diagram illustrating an example substrate processing and repair process 200, according to an embodiment. As described with reference to FIG. 1, processing of a substrate 102, including removal of the overfill 110 and the metallic barrier 108 can result in a recess 112, or erosion of the substrate 102 at the location of the interconnects 106. This is also illustrated in FIG. 2, at block (A). Rather than discard the substrate 102 because of the defects, the defective substrate 102 may be repaired or recovered by the corrective methods disclosed herein.

Referring to FIG. 2, at block (B), the eroded surface of the substrate 102 can be selectively etched with a first selective etchant (or another removal process can be used) to reduce the material of the surface of the substrate 102 and to cause the interconnects 106 to protrude above a reduced surface of the substrate 102, or above a surface of the recess 112. For example, the surface of the substrate 102 can be selectively wet or dry etched (e.g., with the first selective etchant), using the interconnects 106 as an indicator of a stopping point. This can form a substantially planar surface on the substrate 102, with the interconnects 106 protruding a preset distance from the surface of the substrate 102, or above a surface of the recess 112 without protruding above the surface of the substrate 102. The substrate 102 surface may be partially and selectively etched using a dry or wet etch method, for example. Regardless of the method of the partial removal step, it is desirable for the removal process to avoid degrading the smoothness of the top surface of the substrate 102 (e.g., increasing the roughness of the surface of the substrate 102).

Referring again to FIG. 2, at blocks (A) and (B), a first wet selective etchant may be used to selectively etch the surface of the substrate 102 without roughening the metallic interconnects 106, and without roughening the new etched surface of the substrate 102. In an embodiment, the first selective etchant does not substantially affect the roughness of the surface of the substrate 102, particularly the flatness/smoothness (nano-scale topography) of the surface. In some embodiments, after removing portions of the substrate 102, the resulting surface roughness is less than 2 nm, and in other cases less than 0.5 nm. In an embodiment, the removal of substrate 102 material is a function of time, that is, the longer the selective etchant is allowed to contact the surface of the substrate 102, the more material of the substrate 102 is removed. Accordingly, the first selective etchant is applied for a specified period of time.

In an implementation, the first selective etchant comprises glycerated diluted hydrofluoric acid or buffered hydrofluoric acid or ammonium fluoride, organic acid, and deionized water, with or without a stabilizing additive. In some formulary, a first selective etchant for the substrate 102 may comprise an inorganic or organic acid containing a fluoride ion. It is preferable that the content of the fluoride ion be less 2% and preferably less than 0.5% and preferably less than 0.1%. Examples of the sources of fluoride ions may include hydrofluoric acid, buffered oxide etch, ammonium fluoride, or tetrabutylammonium fluoride. The first selective etchant solution may also comprise aliphatic or non-aliphatic organic acids, and more than one organic acid may be used in the formulary. The organic acid content of the first selective etchant may typically be less than 2% and preferably less than 1%, and preferably less than 0.1%. Examples of organic acid may include formic acid, acetic acid, methyl sulfonic acid and their likes. In some embodiments, mineral acids (for example, a very small amount of sulfuric acid) may be used. However, the amount used should not roughen the surface of the etched metallic interconnect 106.

In various embodiments, glycerol is incorporated into the first selective etchant, where the content of glycerol may vary between 0.5 to 25% of the formulary, and preferably under 10%. In other applications, a very small amount of amide, amines, butylated hydroxyanisole (BHA), butylated hydroxytoluene, or organic carbonates may be added to the formulary. In other embodiments, the first selective etchant may be mildly alkaline with a pH preferably less than 9.5 and preferably less than 8.5. It is preferable that the total content of these additional additives be less than 5% and preferably less than 1%. It is also desirable that a complexing agent that suppresses the removal or etching or roughening of the surface of the metallic interconnect 106 be incorporated into the formulary. In the case of copper, for example, a suitable copper complexing agent with one or more triazole moieties may be used. The concentration of the complexing agent is desired to be less than 2%, and preferably less than 1%, 0.2%, and less than 100 ppm and less than 5 ppm in some instances. In some applications, after the selective removal of material of the substrate 102, the complexing agent on the surface of the interconnect 106 may be removed with a suitable solvent, for example an alcohol, such as methanol. In other instances, the complexing agent may be removed from the surface of the interconnect 106 by a radiation method or by a thermal treatment to sublime the complexing agent from the surface of the interconnect 106.

In some embodiments, the application of a complexing agent may not be desirable. In such an embodiment, the first etchant can be de-oxygenated to remove undesirable oxygen content from the fluid. Dissolved gasses in the first selective etchant may be removed by a membrane process, for example, using 3M Corporation® Liqui-Cel™ Membrane Contactor or Contactors, or the like. Removing dissolved oxygen and carbon dioxide from the first selective etchant increases the selectivity of the removal rate of the material of the substrate 102 with respect to the interconnect structures 106.

Figure 4:
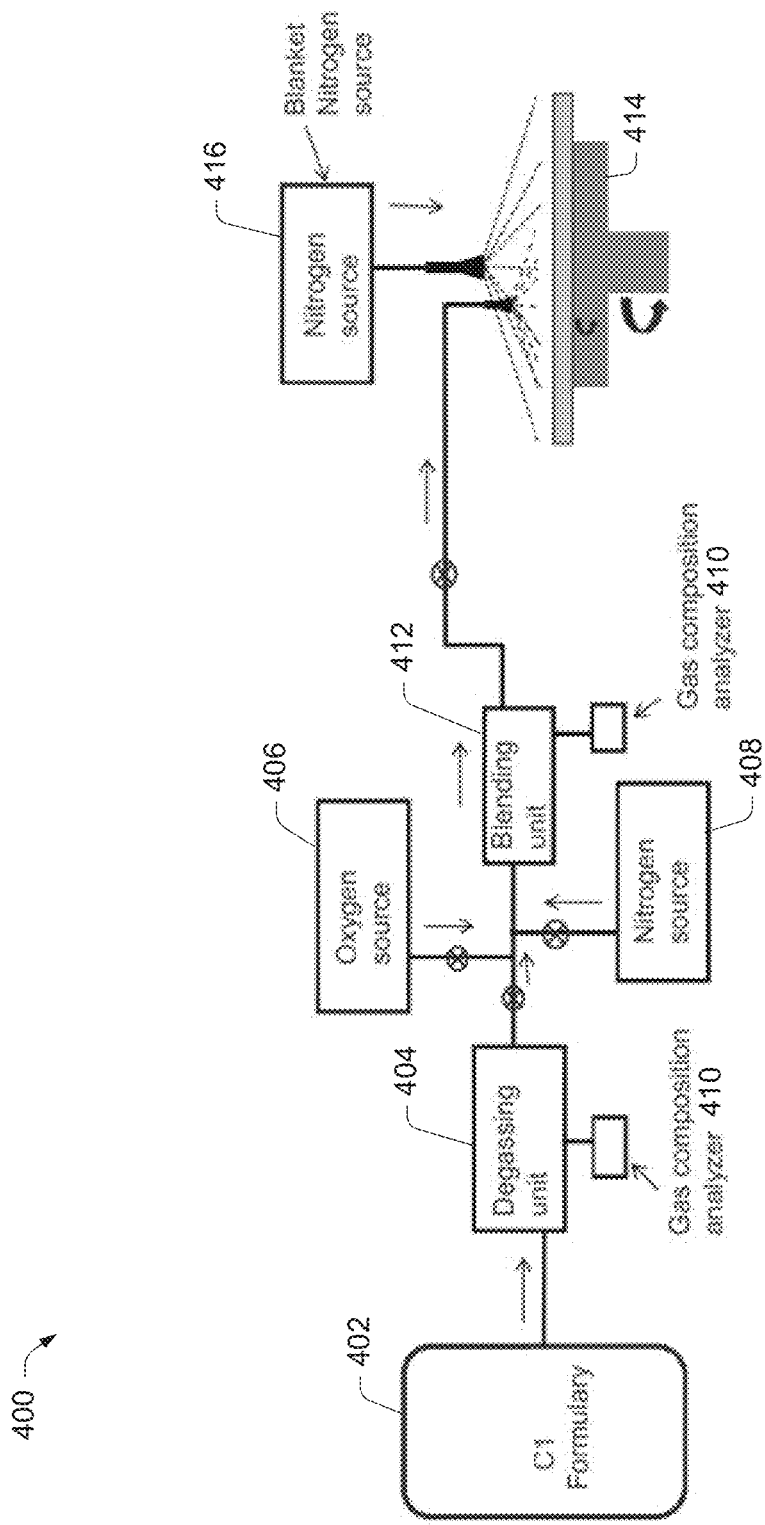
FIG. 4 is a schematically illustrated block diagram of a reactor for microelectronic element surface control.

In other embodiments, after the removal of dissolved oxygen and carbon dioxide from the first selective etchant, nitrogen gas may be incorporated into the first selective etchant by a suitable inline blending scheme, for example (see FIG. 4). Addition of nitrogen in the first selective etchant may protect the surface of the interconnect 106 during the substrate 102 removal step. For a range of first selective etchant formularies, the substrate 102 removal rate may be reduced by reducing the temperature of the first selective etchant and the removal rate may be increased by increasing the temperature of the first selective etchant. The etching rate of the first selective etchant on the substrate 102 may range between 0.01 nm/s to 5 nm/s, for example. Also, the etching selectivity between the substrate 102 and the interconnect 106 may range between 2 to 100 or even higher.

In some embodiments, the first selective etchant may be used as a surface cleaning etchant. For example, after stripping a resist layer from the surface of the substrate 102, the residual resist layer may be ashed in a plasma containing oxygen species, and any remaining residual resist layer and byproducts of the of the ashing step, including particulates, may be cleaned off the substrate 102 by applying the first selective etchant for a period of time, varying from less than 10 seconds to 300 seconds or even more, before rinsing and drying the substrate 102. In some applications, the first selective etchant may be applied to clean the surface of the substrate 102 and also the surface of the interconnect 106, to remove dirty and undesirable metal oxide from the surface of the interconnect 106 prior to the bonding operation.

In some embodiments, the process can include selectively wet etching the metallic interconnects 106 to shape or size the interconnects 106, without roughing the surface of the substrate 102. In an embodiment, a second selective etchant is used for this step in the process. The second selective etchant reduces and/or removes the desired conductive material of the interconnects 106 while maintaining a low surface roughness of the substrate 102.

For example, in the embodiment, the second selective etchant does not substantially affect the surface of the substrate 102, particularly the flatness/smoothness (nanoscale topography) of the surface. In an embodiment, the removal of the conductive material is a function of time, that is, the longer the second selective etchant is allowed to contact the metal of the interconnects 106, the more metal of the interconnects 106 is removed. Accordingly, the selective etchant is applied for a specified period of time.

In one implementation, the second selective etchant comprises a composition that removes the interconnect 106 metal (in the case of copper or copper oxide) at a controlled rate. The removal is such that the roughness (and lack of roughness) of the metal (e.g., copper) remains practically unchanged after the removal step. In one embodiment, after the metal removal step, the roughness of the metallic interconnect 106 is less than 2 nm, and in other cases, the roughness is less 0.5 nm. One unique attribute of the formulary of the second selective etchant is that the roughness of the etched metal of the interconnect(s) 106 is independent of the duration of the etch. Etching with the second selective etchant can be performed until the surfaces of the interconnects 106 are at a desired height above or below the surface of the substrate 102, to prepare the interconnects 106 for bonding.

In an implementation, the second selective etchant comprises a glycerated diluted oxidizing agent, organic acid, and deionized water, with or without a stabilizing additive. In an example, a formulary of the second selective etchant for the metallic interconnects 106 may comprise an inorganic or organic peroxide, typically less than 2% and preferably less than 0.5%. An example of the oxidizing agent may include hydrogen peroxide and urea peroxide. One or more oxidizing agents may be used in the formulary for the second selective etchant. The organic acid may comprise aliphatic or non-aliphatic organic acids, and also more than one organic acid may be used in the formulary. The organic acid content of the second selective etchant may typically be less than 2% and preferably less than 1% and preferably less than 0.1%. Examples of the organic acid may include formic acid, acetic acid, methyl sulfonic acid, and their likes. In some embodiments, mineral acids (for example, a very small amount of sulfuric acid) may be used, however, the amount should not roughen the surface of the etched metallic interconnect 106.

In one embodiment, glycerol is incorporated in the second selective etchant, where the content of glycerol may vary between 0.5 to 25% of the formulary, and preferably under 10%. In other applications, a very small amount of amide, amines, butylated hydroxyanisole (BHA), butylated hydroxytoluene, or organic carbonates may be added to the formulary. It is preferable that the total content of these additional additives, apart from glycerol, be less than 5% and preferably less than 1%.

In some embodiments, the first selective etchant may be modified to etch the surface of the interconnect(s) 106. For example, with or without the removal of dissolved oxygen and carbon dioxide from the first selective etchant, a metal oxidizing material (for example oxygen gas) may be incorporated into the first selective etchant by a suitable inline blending scheme, for instance (see FIG. 4). Addition of oxygen to the first selective etchant can increase the removal rate of the material of the interconnect 106 relative to the removal rate of the material of the substrate 102. For a range of first selective etchant formularies, the interconnect 106 material removal rate may be reduced by reducing the temperature of the oxygenated first selective etchant, and the material removal rate may be increased by increasing the temperature of the oxygenated first selective etchant. The interconnect 106 etching rate of the oxygenated first selective etchant may range between 0.01 nm/s to 5 nm/s or higher for example. Also, the etching selectivity between the interconnect 106 and the substrate 102 may range between 2 to 10 or even higher.

As disclosed in the foregoing, by modifying the oxygen content of the first selective etchant, the first selective etchant may be used to selectively remove the substrate 102, or the interconnect 106, or both, at desirable rates without roughening the surface of the substrate 102.

Figure 3:
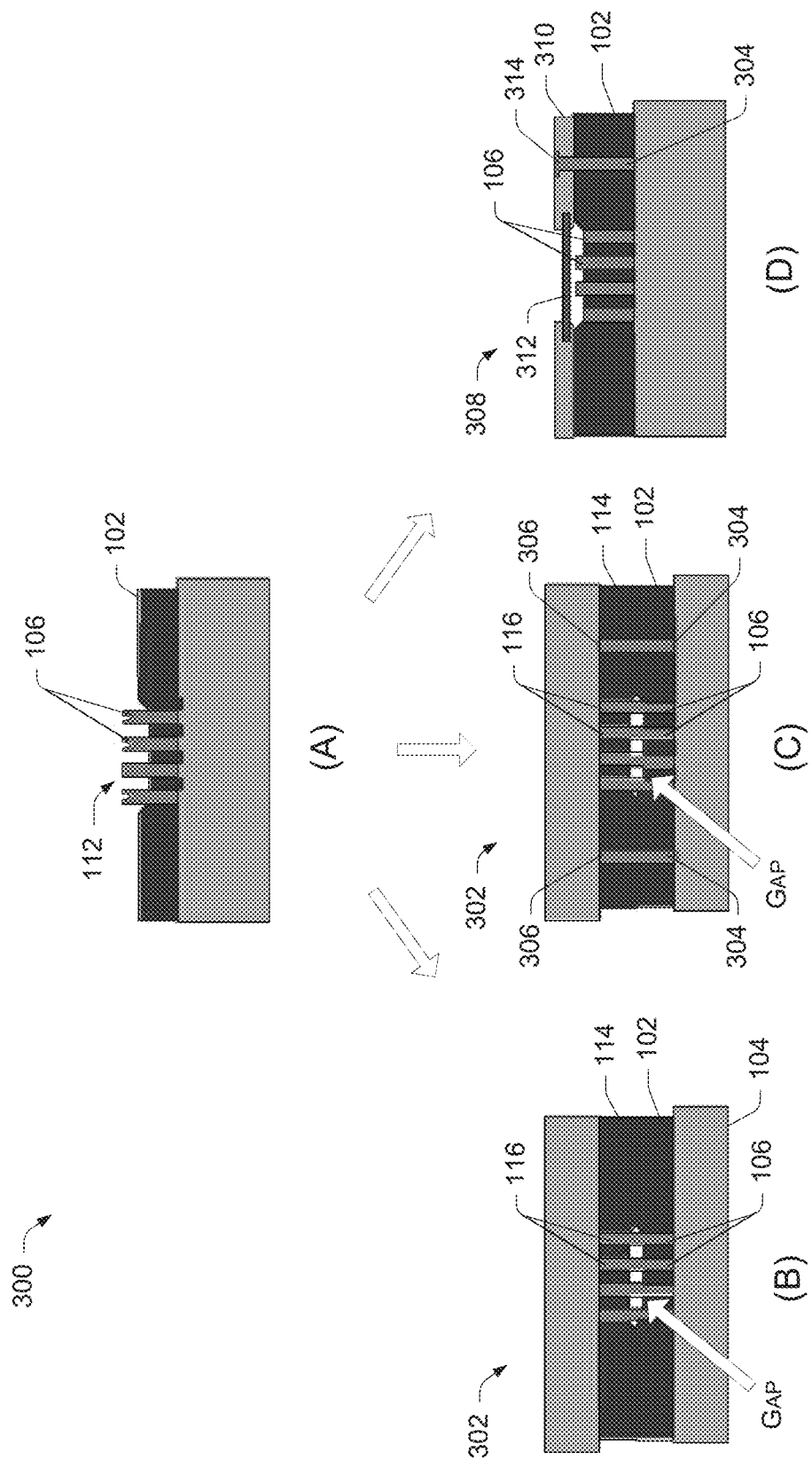
FIG. 3 is a schematically illustrated block flow diagram illustrating examples of substrate processing and repair sequences, according to various embodiments.

FIG. 3 is a schematically illustrated flow diagram illustrating an example of a substrate processing and repair sequence 300, according to various embodiments. As shown at block (A), the substrate 102 is prepared in a damascene process as described with reference to FIG. 1, and the surface of the substrate 102 is reduced as described with reference to the process 200 described in FIG. 2. The interconnects 106 protrude a preselected height above the reduced surface of the substrate 102 or above a surface of the recess 112. Blocks (B), (C), and (D) illustrate three example alternatives within the process 300 for microelectronic assemblies based on the substrate 102 of block (A).

As described above, the interconnect structures 106 may be partially selectively etched relative to the surface of the substrate 102 and/or the surface of the recess 112 (using the second selective etchant or the oxygenated first selective etchant, for example). Also in alternate embodiments, the surface of the substrate 102 may be patterned to expose the eroded portion of the surface of the substrate 102. Thereafter, the substrate 102 and the interconnect structures 106 in the eroded region are etched using the first and second selective etchants described earlier. For example, the desired metallic interconnect structures 106 may be partially etched with the second selective etchant (or the oxygenated first selective etchant) for 20 nm to up to 10 microns or more, to achieve the desirable height above a surface of the recess 112 without protruding above the surface of the substrate 102. Then the dielectric region adjacent to the etched metal interconnect structure 106 may be etched with the first selective etchant to the desirable depth, if needed. The resist layer is stripped, and the substrate 102 is cleaned and prepared for non-adhesive bonding.

In various embodiments, as illustrated at blocks (B) and (C) of FIG. 3, an additional substrate 114 can be prepared in like manner to the substrate 102, having interconnects 116 prepared in like manner to the interconnects 106. In the embodiments, the substrate 114 is bonded to the substrate 102 (using a direct bonding technique, or the like) to form an intermediate workpiece 302 or other microelectronic element or structure, such as an interconnect device, or the like. In the embodiments, the substrate 114 is bonded to the substrate 102 such that the interconnects 116 are aligned and bonded to the interconnects 106, forming continuous conductors.

At block (B), the interconnects 106 and 116 form pass-through conductors, which also pass through the gap formed between the substrates 102 and 114, due to the erosion of one or both of the substrates 102, 114. Because the dielectric at the surfaces of the substrates 102 and/or 114 was reduced following the process 200, as described with respect to FIG. 2, the interconnects 106 and 116 are able to reach and bond with each other despite the recess 112. In an example, the interconnects 106 and 116 are in contact and may bond through pressure, heat, or other manner of fusing the conductors.

At block (C), the interconnects 106 and 116 form pass-through conductors, which also pass through the gap formed between the substrates 102 and 114. Additionally, interconnects 304 embedded within substrate 102 bond to interconnects 306 embedded within substrate 114. Note that there is less or no gap due to erosion at the bonding locations of interconnects 304 and 306. For example, interconnects 304 and 306 may have a coarser pitch or be more isolated from adjacent interconnects as compared to the plurality of interconnects 106 and 116, which may be more densely placed.

The interconnects 106 and 116 at block (C) of FIG. 3 are shown as mostly aligned, however, the process does permit some misalignment as the two interconnects 106 and 116 need only touch at one of the facing surfaces of the interconnects 106 and 116 or even along an edge of the interconnects 106 and 116. Also, as described earlier, any portion of the surface of substrate 102 or 104 or both may be masked and the conductive features and/or dielectric features may be selectively partially removed as desired to a desirable depth.

The example device 308 illustrated at block (D) of FIG. 3 may be formed from the substrate 102 configuration, prior to additional etching, as shown at block (A) of FIG. 2. Alternately, device 308 may be formed from the substrate 102 configuration, after additional etching, as shown at block (B) of FIG. 2 and block (A) of FIG. 3. In either case, a second substrate 310 is bonded to the planar surface of the substrate 102, where the second substrate 310 has a void (e.g., opening, hole, cut-out, etc.) over the eroded region 112 of the substrate 102. Additionally or alternatively, the second substrate 310 may not have an opening and may form an enclosed cavity. In such an example, the underlying semiconductor and or conductive features may form part of a MEMS device, or the like. The second substrate 310 or portions of the second substrate 310 may be permeable or impermeable to certain fluids, such as gas or liquids, or to an electric field, magnetic field, or optical radiation, and their various combinations. The second substrate 310 may include a glass, semiconductor, organic or inorganic component for support, reliability, or performance. The second substrate 310 may be directly bonded to the substrate 102 or may be glued, etc. The second substrate 310 may additionally have conductive features provided at its surface to enable a hybrid or direct bonding technique, or the like.

In various embodiments, the device 308 can be used in the illustrated configuration as a sensing device (such as a micro electro-mechanical (MEMS) device), or the like. In an example, a membrane 312 can be positioned across the void in the second substrate 310 and over the protruding metal interconnects 106 (which act as sensing conductors in this configuration). The membrane 312 may permit or prohibit light, gas, or liquid to pass through the opening in the second substrate 310.

In addition, as illustrated, the device 308 can include one or more pass-through interconnects 304 (passing through the substrate 102) which can bond to vias 314 (or the like) embedded within the second substrate 310, or may otherwise connect to circuitry outside of the substrate 102.

In some embodiments, one or more of the metallic layer in the via 314 or trench may be selectively or completely removed to form an open channel (not shown). In this form the open channel may be used or formed for non-electrical communication, for example for optical communication or optical sensing. In other applications, the device 308 may be applied or formed for electro-optical applications.

FIG. 4 illustrates an example reactor 400, or in other words a suitable inline blending scheme for the etching formulary, as discussed above. The example reactor 400 includes a receptacle 402 for containing and dispensing the formulary. In various processes, the formulary may include the first selective etchant or the second selective etchant (or both as a combination or as when they are the same etchant), for example. In other embodiments, the formulary may include other etchants or process formulary.

As discussed above, a degassing unit 404 may be used to remove oxygen and/or carbon monoxide and/or carbon dioxide from the formulary. Dissolved gasses in the formulary may be removed by a membrane process, for example, using 3M Corporation® Liqui-Cel™ Membrane Contactor or Contactors, or the like. The liquid formulary is passed through the membrane, removing the unwanted gasses (e.g., oxygen and carbon dioxide) from the formulary. This allows for control of the selectivity of the formulary, according to the selective etching desired. For example, oxygen and/or nitrogen may be added from the oxygen source 406 and/or the nitrogen source 408 as desired after the degassing. In alternate embodiments, other techniques may be used to remove unwanted gasses from the formulary that do not include a membrane.

A gas composition analyzer 410 may be employed after degassing and/or after adding and blending (for example at blending unit 412) oxygen and/or nitrogen to the formulary to observe and ensure that the formulary includes the desired concentration (or lack of) gasses of interest (e.g., oxygen, carbon dioxide, nitrogen, etc.). Adjustments or corrections may be made at the degassing unit 404, the oxygen source 406, and/or the nitrogen source 408 as desired.

As discussed above, a lower concentration of oxygen (or a lack of oxygen) in the formulary (the first selective etchant, for instance) allows for etching the substrate 102 without etching or corroding the metallic interconnect(s) 106. Also, any copper oxide of the interconnect(s) 106 is etched with a reduced oxygen concentration in the formulary, cleaning the interconnect(s) 106. Increasing the concentration of oxygen in the formulary allows the formulary to etch (e.g., dissolve) the metallic interconnect(s) 106 faster than etching the substrate 102, particularly if the interconnect(s) 106 are comprised of copper and copper oxide, or the like. Accordingly, the interconnect(s) 106 can be etched without damaging the substrate 102, using a predetermined increased oxygen concentration of the formulary, and applying this formulary for a predetermined time duration.

Increasing the volume of nitrogen from the nitrogen source 408 can be used to reduce the concentration of oxygen in the formulary, as well as reducing or stopping the flow of oxygen from the oxygen source 406. Contrarily, the flow of oxygen can be increased and/or the flow of nitrogen decreased to increase the oxygen concentration of the formulary. The pH of the formulary can be controlled in like manner, for acidic or alkaline etching as desired. For instance, in some cases (e.g., to etch copper without etching copper oxide), an alkaline etching formulary is desired.

The desired formulary is applied to the substrate 102 and/or the interconnect(s) 106, for instance while the substrate 102 is on a spinning surface 414, or the like. A blanket nitrogen source 416 may be used to reduce oxygen or other gasses from the application area of the spinning surface 414, to better control the concentration blend of the formulary as it is applied to the substrate 102 and/or the interconnect(s) 106.

In alternate implementations, other techniques may be included in the processes disclosed in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method comprising:
providing a substrate having an upper surface and a conductive material in one or more cavities disposed within a recessed region extending below the upper surface; and
forming one or more conductive interconnect structures from the conductive material within the one or more cavities such that a portion of the one or more conductive interconnect structures protrudes from the one or more cavities into the recessed region, wherein the one or more conductive interconnect structures extend above a lower surface of the recessed region surrounding the one or more cavities and wherein the one or more conductive interconnect structures comprise upper end(s) recessed below the upper surface.

2. The method of claim 1, wherein the substrate is a first substrate, the one or more cavities are one or more first cavities, and the one or more conductive interconnect structures are one or more first conductive interconnect structures, the method further comprising:
providing a second substrate having a second upper surface and conductive material in one or more second cavities extending below the second upper surface and forming one or more second conductive interconnect structures from the conductive material within the one or more second cavities;
bonding the second substrate to the first substrate, the recessed region of the first substrate and the second substrate forming a gap; and
bonding the one or more second conductive interconnect structures to the one or more first conductive interconnect structures of the first substrate.

3. The method of claim 2, wherein the second upper surface defines a top surface of the second substrate and wherein at least one of the one or more second conductive interconnect structures protrudes above the second upper surface.

4. The method of claim 2,
wherein the recessed region is a first recessed region and the lower surface is a first lower surface,
the method further comprising forming a second recessed region in the second substrate, wherein the second recessed region extends below the second upper surface, wherein the second recessed region surrounds the one or more second cavities and the one or more second conductive interconnect structures, and wherein a portion of the one or more second conductive interconnect structures protrudes from the one or more second cavities above a second lower surface of the second recessed region; and
wherein, after bonding, the first recessed region of the first substrate overlaps the second recessed region of the second substrate and the gap is between the first lower surface and the second lower surface.

5. The method of claim 4, wherein at least one of the first recessed region and the second recessed region includes multiple interconnect structures disposed therein.

6. The method of claim 2, further comprising:
forming one or more third conductive interconnect structures extending through the first substrate and one or more corresponding fourth conductive interconnect structures extending through the second substrate, the one or more third and fourth conductive interconnect structures disposed outside of the recessed region of the first substrate; and
bonding the one or more third conductive interconnect structures to the one or more fourth conductive interconnect structures.

7. The method of claim 2, further comprising bonding the second upper surface of the second substrate to the first upper surface of the first substrate, and bonding the one or more second conductive interconnect structures to the one or more first conductive interconnect structures of the first substrate, using a direct bonding technique without an intervening adhesive.

8. The method of claim 1, wherein the substrate is a first substrate, the method further comprising:
providing a second substrate having a void through the second substrate;
bonding the second substrate to the upper surface of the first substrate with the void of the second substrate disposed over the recessed region of the first substrate; and
coupling a membrane to the second substrate, over the void of the second substrate and over the one or more conductive interconnect structures of the first substrate.

9. The method of claim 8, further comprising forming a micro electro-mechanical (MEMS) device from at least the bonding and the coupling.

10. The method of claim 8, further comprising:
forming one or more third conductive interconnect structures extending through the first substrate, and one or more corresponding fourth conductive interconnect structures extending through the second substrate, the one or more third and fourth conductive interconnect structures disposed outside of the recessed region of the first substrate; and
bonding the one or more third conductive interconnect structures to the one or more fourth conductive interconnect structures.

11. The method of claim 1, wherein the substrate is a first substrate, the method further comprising:
providing a second substrate that is permeable to one or both of a light spectrum and one or more predefined fluids; and
bonding the second substrate to the surface of the first substrate such that the second substrate covers the recessed region of the first substrate and the one or more conductive interconnect structures of the first substrate.

12. The method of claim 1, wherein the substrate is a first substrate, the method further comprising:
providing a second substrate that is impermeable to one or more predefined fluids; and
bonding the second substrate to the upper surface of the first substrate such that the second substrate covers the recessed region of the first substrate and the one or more conductive interconnect structures of the first substrate.

13. The method of claim 1, further comprising selectively etching the one or more conductive interconnect structures, such that the one or more conductive interconnect structures have a variance in surface topology of less than 2 nanometers after the selectively etching.

14. The method of claim 1, wherein the one or more cavities comprises a plurality of cavities with the conductive material in each of the plurality of cavities, and wherein forming one or more conductive interconnect structures comprises forming a plurality of conductive interconnect structures.

15. The method of claim 1, wherein the one or more conductive interconnect structures comprises a plurality of conductive interconnect structures disposed within the recessed region.

16. The method of claim 1, further comprising etching the one or more conductive interconnect structures, such that the one or more conductive interconnect structures have a variance in surface topology of less than 2 nanometers after the etching.

17. The method of claim 1, further comprising:
etching the upper surface of the substrate.

18. The method of claim 17, wherein etching the upper surface of the substrate comprises etching the upper surface of the substrate with an etchant and wherein the etchant comprises: glycerated diluted hydrofluoric acid or buffered hydrofluoric acid, organic acid, and deionized water, with or without a stabilizing additive.

19. The method of claim 17, further comprising etching the one or more conductive interconnect structures and smoothing a surface topology of the one or more conductive interconnect structures.

20. The method of claim 19, wherein etching the one or more conductive interconnect structures comprises etching the one or more conductive interconnect structures with an etchant, and wherein the etchant comprises: one or more oxidizing agents, one or more organic acids, and glycerol, wherein the one or more oxidizing agents and the one or more organic acids are each less than 2% of formulary.

21. The method of claim 1, further comprising
bonding a microelectronic component having one or more conductive features to the upper surface; and
interconnecting and electrically coupling one or more of the one or more conductive interconnect structures to the one or more conductive features of the microelectronic component.

22. A method comprising:
providing a substrate having an upper surface and a plurality of cavities disposed in the upper surface, wherein each of the plurality of cavities contains conductive material;
etching a recessed region into the upper surface until a portion of the conductive material in each of the plurality of cavities protrudes above the etched recessed region below the upper surface, forming a plurality of interconnect structures within the recessed region from the conductive material in the plurality of cavities, and smoothing a surface topology of the upper surface;
etching an amount of conductive material from the plurality of interconnect structures, and smoothing a surface topology of the plurality of interconnect structures; and
bonding a microelectronic component having a smooth surface topology to the upper surface.

23. The method of claim 22, wherein the microelectronic component has a plurality of conductive features; and
further comprising interconnecting and electrically coupling one or more of the plurality of interconnect structures to one or more of the plurality of conductive features of the microelectronic component.

24. The method of claim 22, wherein etching the recessed region into the upper surface comprises etching the upper surface with an etchant and wherein the etchant comprises: glycerated diluted hydrofluoric acid or buffered hydrofluoric acid, organic acid, and deionized water, with or without a stabilizing additive.

25. The method of claim 22, wherein etching the amount of conductive material from the plurality of interconnect structures comprises etching the plurality of interconnect structures with an etchant and wherein the etchant comprises: one or more oxidizing agents, one or more organic acids, and glycerol, wherein the one or more oxidizing agents and the one or more organic acids are each less than 2% of formulary.

26. The method of claim 22, wherein bonding the microelectronic component to the upper surface comprises bonding the microelectronic component to the upper surface using a direct bonding technique without an intervening adhesive.

27. The method of claim 22, wherein:
the substrate comprises a first substrate, the plurality of interconnect structures comprises a first plurality of interconnect structures, and the microelectronic component comprises a second substrate having a second plurality of interconnect structures; and
bonding the microelectronic component to the upper surface comprises bonding the second plurality of interconnect structures to the first plurality of interconnect structures of the first substrate.

28. The method of claim 22, wherein, after etching the amount of conductive material from the plurality of interconnect structures, the plurality of interconnect structures are recessed within the recessed region and below the upper surface.

* * * * *